United States Patent [19]

Devecchi et al.

[11] Patent Number: 4,555,644
[45] Date of Patent: Nov. 26, 1985

[54] OUTPUT INTERFACE FOR A THREE-STATE LOGIC CIRCUIT IN AN INTEGRATED CIRCUIT USING MOS TRANSISTORS

[75] Inventors: Daniele Devecchi, Desio; Guido Torelli, S. Alessio, both of Italy

[73] Assignee: SGS-ATES Componenti Elettronici SpA, Agrate Brianza, Italy

[21] Appl. No.: 560,401

[22] Filed: Dec. 12, 1983

[30] Foreign Application Priority Data

Dec. 17, 1982 [IT] Italy ................. 24816 A/82

[51] Int. Cl.$^4$ .................. H03K 4/24; H03K 17/06; H03K 19/096; H03K 4/58
[52] U.S. Cl. ................. 307/482; 307/450; 307/473; 307/578
[58] Field of Search ............. 307/443, 450, 453, 473, 307/475, 481, 482, 578, 583, 584, 269, 270, 525, 527, 528, 511, 514

[56] References Cited

U.S. PATENT DOCUMENTS 3,889,135 6/1975 Nomiga et al. .................. 307/482
4,291,242 9/1981 Schriber ......................... 307/270
4,430,586 2/1984 Hebenstreit ................... 307/482 X
4,468,576 8/1984 Takemae ....................... 307/453 X
4,477,741 10/1984 Moser, Jr. ..................... 307/473

FOREIGN PATENT DOCUMENTS 58-9432 1/1983 Japan ............................ 307/482

Primary Examiner—Stanley D. Miller
Assistant Examiner—David R. Bertelson
Attorney, Agent, or Firm—Wenderoth, Lind & Ponack

[57] ABSTRACT

An output interface which includes a capacitor which is charged to a relatively high voltage by a voltage source which may have a high internal impedance, and a switching circuit which is controlled by an output of the associated logic circuit and which connects the capacitor with a gate electrode of a transistor of the final stage of the interface in order to bias it at a higher voltage than that of the power supply only during a prespecified logic state of the logic circuit and which keeps the capacitor essentially isolated (i.e.—floating) during any other logic state.

3 Claims, 5 Drawing Figures

OUTPUT INTERFACE FOR A THREE-STATE LOGIC CIRCUIT IN AN INTEGRATED CIRCUIT USING MOS TRANSISTORS

BACKGROUND OF THE INVENTION

The present invention relates to integrated circuits with MOS (Metal Oxide Semiconductor) transistors having a single type of charge carriers and, more particularly, to an output interface circuit for a three-state logic circuit of such an integrated circuit.

In the following sections a description will be given of circuits that use only N-channel MOS transistors in which the charge carriers are electrons. It will be understood, however, that the same description is also applicable to similar circuits using only P-channel MOS transistors in which the charge carriers are holes, provided that the polarities of the voltages are reversed.

As a rule, the three logic states transmitted from the interface circuit to an output terminal of the integrated circuit are defined by the voltage values that can be assumed by the output terminal. More specifically, a first state is characterized by a high-voltage level, i.e., a voltage which is close to the voltage of the positive terminal of the power supply; a second state is characterized by a low-voltage level, i.e., a voltage which is close to the voltage of the negative terminal of the power supply; and the third state is defined by an intermediate level determined by the user circuit connected to the output. From the viewpoint of the current supplied to the user circuit, i.e., of the impedance offered by the output of the interface circuit, the first state offers a high impedance relative to the negative terminal of the power supply and a low impedance relative to the positive terminal of the power supply, the second state offers a low impedance relative to the negative pole and a high impedance relative to the positive pole, and the third state offers a high impedance relative to both terminals of the power supply. In many applications, particularly in those utilizing a relatively low supply voltage, e.g., 5 volts, it is important that in the state characterized by the high-voltage output level, the voltage at the output terminal must be very close to the voltage of the positive terminal of the power supply. This requirement can be easily complied with by using an additional power supply capable of supplying a higher voltage than the main power supply voltage. However, when it is not possible or desired to use such an additional power supply, or if only a high-voltage generator is available with a very high internal impedance and which, therefore, is unable to supply the necessary power, one usually resorts to circuit arrangements which, by means of one or more capacitors, make it possible during limited period of time to reach higher voltages than the power supply voltage. The latter solution, however, is not convenient in applications where the dwell time of the output signal may be relatively long, because this requires the use of high-capacity capacitors which, therefore, cannot be integrated, or can only be integrated with a great outlay of the useful area of the integrated circuit.

SUMMARY OF THE INVENTION

The primary object of the present invention is to provide an interface circuit which is capable of outputting signals of a long duration without using capacitors having high capacitance and which can operate properly even when a high-voltage generator having a high internal impedance is used.

According to the present invention, this object is achieved by means of the circuit defined and characterized in the appended claims.

BRIEF DESCRIPTION OF THE DRAWINGS

For a more complete understanding of the present invention, reference is now made to the following description taken in conjunction with the accompanying drawings, in which.

DESCRIPTION OF THE PREFERRED EMBODIMENT

Figure 3A:
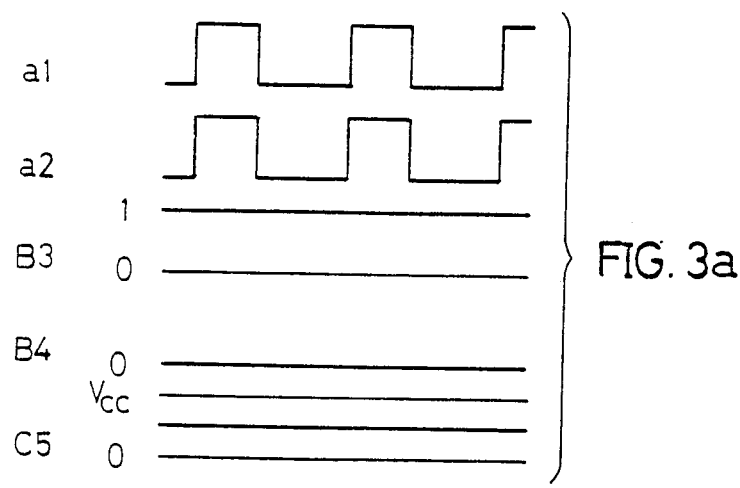
FIGS. 3a–3c show waveforms which illustrate the operation of the circuits of FIGS. 1 and 2.
Figure 3B:
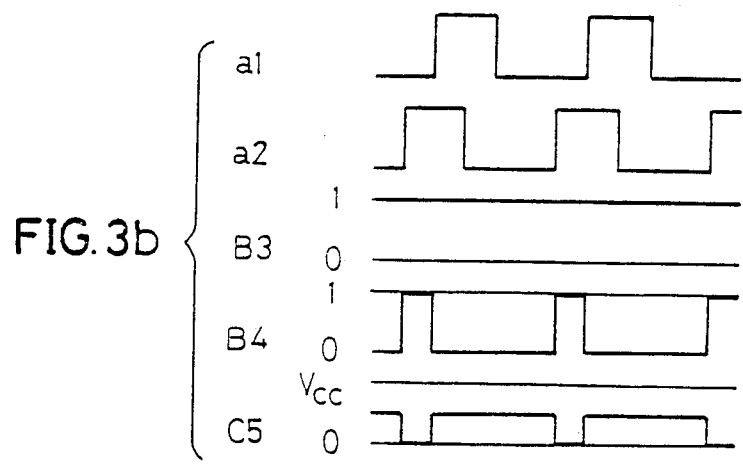
Figure 3C:
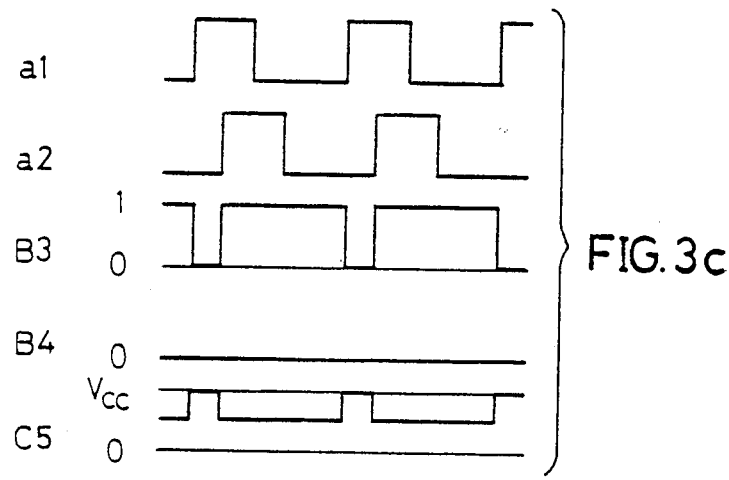

Now referring to the drawings, and more particularly to FIGS. 1 and 3a–3c, a phase comparator CP compares the phases of two pulse signals a1 and a2 having the same predetermined frequency, e.g., 1 KHz, and respectively supplied to input terminals 1 and 2. The comparator CP supplies at its output terminals 3 and 4, the result of three possible combinations of binary logic states. Since comparator CP is of a known construction, it will be described in the following section solely from a functional viewpoint. It is so designed that, when the two input signals a1 and a2 are in phase, as shown in FIG. 3a, output terminal 3 is at a positive voltage of a stated level corresponding to the binary state 1, while output terminal 4 is at a lower voltage, close to that of ground, corresponding to the binary state 0. This can be seen in FIG. 3a where the symbols B3 and B4 refer to the states of terminals 3 and 4, respectively. When input signal a1 lags behind signal a2, as depicted in FIG. 3b, the voltage at output terminal 4 rises to the level 1 at the occurrence of the leading edge of signal a2 and remains there for the duration of the lag, i.e., until the occurrence of the leading edge of signal a1, while the voltage at terminal 3 remains unchanged. When input signal a1 is in phase lead relative to signal a2, as shown in FIG. 3c, the voltage at terminal 3 drops to the level 0 for the duration of the lead, while the voltage at terminal 4 remains at the level 0.

The outputs of the comparator are connected via an interface circuit, denoted in its entirety by CF, to a user circuit represented in the figure by a voltage divider made up of high-resistance resistors R1 and R2 inserted between the terminals of a voltage supply and represented by the ground symbol and by the symbol +Vcc. The interface circuit CF has an input inverter comprising two N-channel transistors: one, T1, of the enhancement type, and the other, T2 of the depletion type, inserted in series between ground and the positive terminal of a source of voltage +VBB which is higher than the voltage +Vcc. Transistor T2, which has its drain electrode connected to the positive terminal of voltage source +VBB and has its source and gate electrodes connected together and connected to the drain electrode of T1, constitutes the load of transistor T1. The transistor T1 has its source electrode connected to ground and has its gate electrode connected, as the first input terminal of interface circuit CF, to output terminal 3 of the comparator CP. Transistor T1 also has its drain electrode connected to the source and gate electrodes of load transistor T2 and to the gate electrode of another N-channel enhancement transistor, T3. Transistor T3 has its drain electrode connected to the voltage +Vcc and has its source electrode connected to the drain electrode of another transistor, T4, of the same type. The gate electrode of transistor T4, which has its source electrode connected to ground, is connected to output terminal 4 of comparator CP and constitutes a second input of interface circuit CF. The junction point 5 between transistors T3 and T4 constituting the output stage of interface circuit CF is the output terminal of the circuit and is connected to the intermediate point of voltage divided R1, R2.

During operation, if signals a1 and a2 which are to be compared are in phase, then outputs 3 and 4 of comparator CP are, as mentioned above, at a high level and low level, respectively (FIG. 3a). In this case, transistors T3 and T4 are both inoperative, because their respective gate electrodes are practically at ground level. More specifically, the gate electrode of T3 is connected to ground via transistor T1, which is operative because it has a sufficiently high positive voltage (B3) at its gate electrode. Therefore, the output stage of interface CF is in a state where the impedance of output terminal 5 is high both with respect to ground and with respect to the positive terminal of the power supply. If the high-resistance resistors R1 and R2 are assumed to have equal values, output terminal 5 rises to a voltage level equal to approximately one-half the voltage of the power supply, as shown in FIG. 3a by the waveform labelled C5.

If signal a1 lags behind signal a2, so that outputs 3 and 4 of comparator CP are both at a high level during the lag (FIG. 3b), transistor T4 will be operative during that period because it receives at its gate electrode a sufficiently high positive voltage, and transistor T3 remains cut off because its gate electrode is connected to ground via transistor T1, which is still operative because of the positive voltage present at its gate electrode. In this case, output terminal 5 offers a low impedance relative to ground and a high impedance relative to the positive pole of the power supply so that its voltage, as shown in FIG. 3b falls from a level Vcc/2 to level 0 during the lag.

If signal a1 is leading relative to signal a2, so that outputs 3 and 4 of comparator CP are both at a low level during the lead, transistor T4 is cut off, because its gate electrode is at ground level, while transistor T3 will be made conductive because its gate electrode rises close to voltage VBB (which is higher than Vcc), since transistor T1 will be switched to the off-state as a result of the practically zero voltage supplied to its gate electrode. Thus, an output state occurs, during which terminal 5 offers during the leading phase a high impedance relative to ground, and a low impedance relative to the positive power supply terminal and, thus, has a voltage close to that of power supply +Vcc, as shown in FIG. 3c by the waveform C5.

It should be noted that the interface circuit described above operates properly and has an output level really close to the voltage of the positive terminal of the power supply only if the additional voltage supply is a good power source with a low internal impedance capable of supplying a voltage +VBB that is sufficiently higher than that of the power supply +Vcc so as to make and keep transistor T3 fully conductive. This additional power supply shall have a sufficiently low internal impedance to enable it to supply the current needed to ensure the proper operation of the inverter whose output is connected to the gate electrode of transistor T3. The current absorption by the inverter, when its output is at a low level, substantially depends on the desired speed for the switching of the output state. If an additional source of this type is not available, the inverter may also be supplied with a voltage +Vcc, but the voltage at output terminal 5, in the state of minimum impedance relative to the positive terminal, can only reach a maximum value equal to the difference between the supply voltage +Vcc and the threshold voltage of an enhancement transistor augmented by the so-called body effect (for a total value of approximately 1.5 volts). Therefore, in this case, the output terminal 5 has an impedance relative to the positive terminal which is not the lowest possible imedpance, and a voltage that differs substantially from that of the power supply. It is obvious that these drawbacks are all the more serious, the lower the voltage of power supply Vcc.

Figure 1:
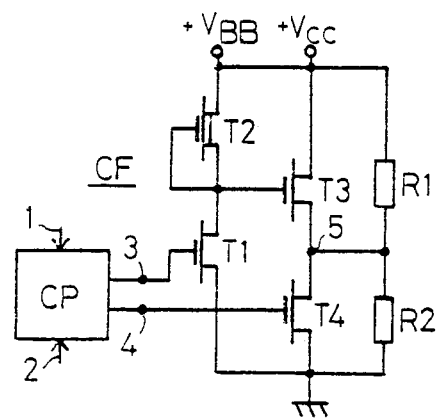
FIG. 1 depicts a logic circuit using a Prior Art output interface.
Figure 2:
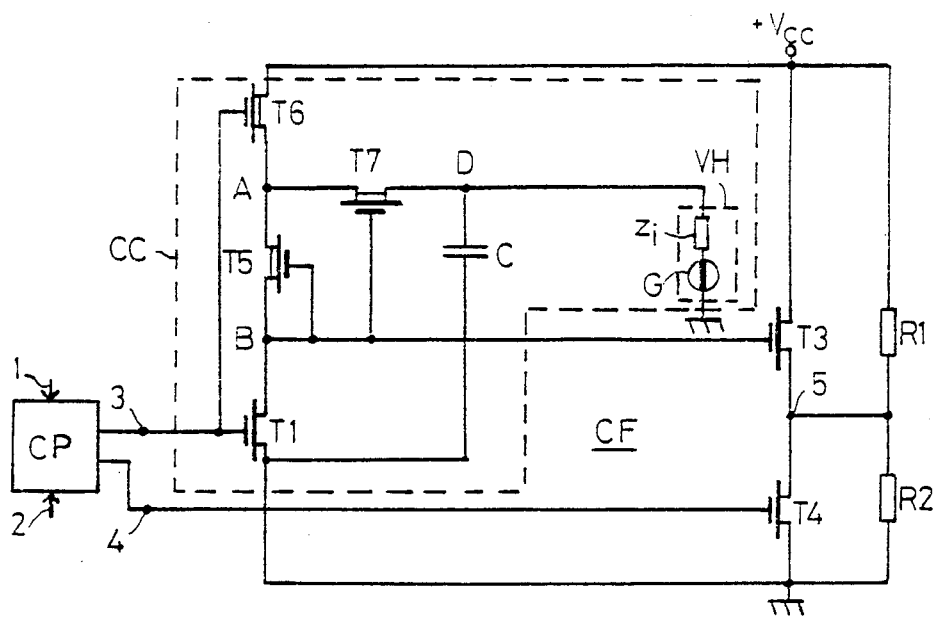
FIG. 2 illustrates a logic circuit which uses an output interface in accordance with the present invention.

In FIG. 2, in which like reference numerals designate like components in FIG. 1, output terminal 3 of comparator CP is connected to the gate electrode of transistor T3 via a circuit indicated by a broken line in the drawing and denoted by the symbol CC, the purpose of which is both to establish a connection between output 3 of comparator CP and transistor T3 of the final stage and to properly bias the latter during a predetermined period. This circuit CC has an N-channel transistor, T1, of the enhancement type, whose source electrode is connected to ground and whose drain electrode connected both to the gate electrode of transistor T3 in the final stage and to the source and gate electrodes, connected together of an N-channel depletion transistor, T5. A second depletion transistor T6 has its gate electrode connected to output terminal 3 of comparator CP and has its drain and source electrodes connected, respectively, to the positive terminal Vcc of the power supply and to the drain electrode of transistor T5. The latter electrode is also connected to the source electrode of a third depletion transistor T7, which has its gate electrode connected to the gate electrode of transistor T3, and has its drain electrode connected to a source of a relatively high voltage (e.g., 15 volts) denoted by the symbol VH. A capacitor C is inserted between the drain electrode of T7 and ground. Voltage supply VH is represented by an ideal voltage generator G in series with an element Zi representing the internal impedance of the voltage supply. The internal impedance of the voltage supply that can be used in the integrated circuit to which the invention can be applied may also be very high, e.g., 10 megohms.

The following is an examination of the operation of the circuit embodying the principles of the present invention under the various phase conditions of input signals a1 and a2 with the aid of FIGS. 2, 3a, 3b and 3c.

If signals a1 and a2 are in phase, or if signal a1 lags behind signal a2, the operation is similar to that of the prior art circuit illustrated in FIG. 1 and is therefore still represented by the waveforms of FIGS. 3a and 3b. It should be noted that in both cases, since they are characterized by a positive voltage at terminal 3 of comparator CP, depletion transistor T6 is also operative, in addition to transistor T1, because its gate-source voltage is positive and, hence, is of such direction as to promote its normal conductive state. Therefore, the voltage between nodes A and B, i.e., between the drain and source electrodes of transistor T5, is very close to the voltage of power supply Vcc, and depletion transistor T7 has a gate-source negative voltage of a sufficiently high level to keep it inoperative. Under these conditions capacitor C, charged to the voltage of power supply VH, cannot be discharged because it has in parallel, as its discharge resistance, only the very high resistance of the reverse-biased junction of the drain of transistor T7 which, therefore, absorbs a current assuredly lower than that which can be supplied by voltage generator VH.

If signal a1 is leading relative to signal a2, both outputs 3 and 4 of the comparator are at a low level during the leading phase, as shown in FIG. 3c. Under these conditions, transistor T1 is cut off because, since it is of the enhancement type, it cannot conduct with its gate electrode practically at the same voltage as its source electrode. Therefore, node B is floating, i.e.—isolated from ground. Since transistor T5 functions as a resistor, the voltage of node A is equal to that of node B. Depletion transistor T7 is operative, because it has its source and gate electrodes at the same voltage, being connected to, respectively, A and B. Therefore, the voltage of nodes A and B is close to the voltage of power supply VH, provided that the depletion transistor is switched to the off-state, i.e., it has a negative gate-source voltage which, in absolute value, is higher than its threshold of conduction. Since the gate electrode of T6 is practically connected to ground then transistor T6 is inoperative. Therefore, transistor T3 has its gate electrode connected only to high-voltage power supply VH, so that it is fully operative. Thus, an output state is obtained in which terminal 5 offers a high impedance relative to ground and a low impedance relative to the positive terminal +Vcc of the power supply, and in which the level of the idle output voltage reaches a value equal to the voltage Vcc. This state is still represented by the waveform C5 in FIG. 3c. However, in contrast to the corresponding output state of the circuit of FIG. 1 supplied by the additional voltage supply +VBB with a low internal impedance, there is obtained by using—besides the conventional power supply +Vcc—a high voltage generator with a very high internal impedance. It should be noted that in the case shown in FIG. 3c, the discharge resistance of capacitor C is very high, because it is that of reverse-biased junctions. Therefore, with the interface circuit in accordance with invention, it is possible to use a capacitor having a very small capacitance and which, thus, can very easily be integrated, even when the signals that are to be compared have relatively low frequencies. In practice, it has been found that, with a supply voltage of 5 V, and a 15 volt auxiliary voltage supply with a high internal impedance and if the frequency of the input signals to be compared is on the order of 1 KHz, then one can obtain output signals that can be utilized under all operating conditions with a capacitance of approximately 8 pF, which can be easily constructed on a small area with integration techniques known in the prior art.

While the present invention has been disclosed with particular reference to a preferred embodiment thereof, the concepts of this invention are readily adaptable to other embodiments, and those skilled in the art may vary the structure thereof without departing from the essential spirit of the present invention.

We claim:

1. An output interface circuit for a three-state logic circuit in an integrated circuit using MOS transistors having a single type of charge carriers, comprising:

a supply voltage source having first and second power supply terminals;

an output stage having first and second enhancement type transistors which are connected in series between said first and second terminals of said supply voltage source, said output stage having an output terminal constituting a junction point between a drain electrode of said first transistor and a source electrode of said second transistor, gate electrodes of said first and second transistors being respectively connected to a first and a second output of said three-state logic circuit so as to provide an output at said output terminal of said output stage which corresponds to the three states of said three-state logic circuit which in turn correspond to combinations of binary logic states of said first and second outputs of said three-state logic circuit;

wherein a connecting and biasing network is connected between said gate electrode of said second transistor and said second output of said three-state logic circuit, said connecting and biasing network having an auxiliary feed terminal which is connected to a first terminal of an auxiliary voltage supply for supplying a predetermined voltage which is higher than that of said supply voltage source, said auxiliary voltage supply having a second terminal which is connected to said first terminal of said supply voltage source, said connecting and biasing network comprising:

a capacitive element having a first electrode which is connected to said auxiliary feed terminal and having a second electrode which is connected to said first terminal of said supply voltage source;

a switching means connected to said gate electrode of said second transistor and to said first electrode of said capacitive element and to said second output of said three-state logic circuit, said switching means connecting said first electrode of said capacitive element to said gate electrode of said second transistor via a low-resistance path when said second output of said logic circuit is in a predetermined binary state and substantially isolating said capacitive element when said second output of said logic circuit is in a binary logic state which is opposite to said predetermined binary logic state.

2. An output interface circuit as recited in claim 1, wherein said connecting and biasing network further comprises:

an enhancement type pilot transistor having its source electrode connected to said first terminal of said supply voltage source and having its drain electrode connected to said gate electrode of said second transistor;

a first depletion type transistor having its drain electrode connected to said second power supply terminal of said supply voltage source and having its source electrode connected via a resistive element to said drain electrode of said pilot transistor, gate electrodes of said pilot transistor and said first depletion transistor being connected together to said second output of said three-state logic circuit;

a second depletion transistor having its source, drain, and gate electrode respectively connected to said source electrode of said first depletion transistor and said first electrode of said capacitive element and said gate electrode of said second transistor.

3. An output interface as recited in claim 2, wherein said resistive element comprises a depletion type transistor having its source and gate electrodes connected together.

* * * * *